Figure 1:
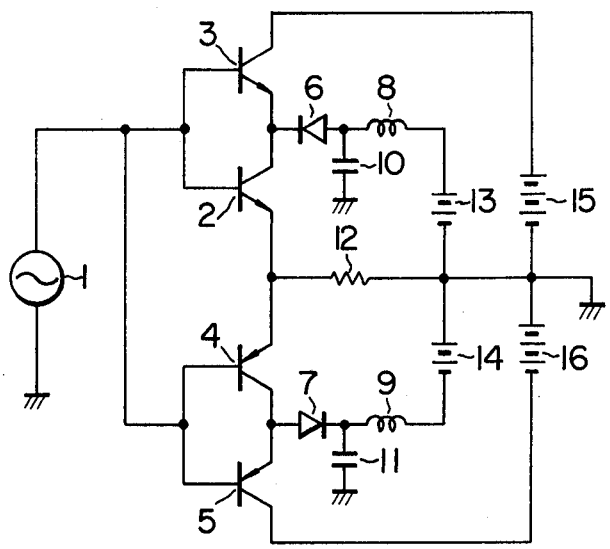

United States Patent [19]

Sampei

[11] 4,045,744
[45] Aug. 30, 1977

[54] LOW-FREQUENCY POWER AMPLIFIER

[75] Inventor: Tohru Sampei, Toyokawa, Japan

[73] Assignee: Hitachi, Ltd., Japan

[21] Appl. No.: 734,602

[22] Filed: Oct. 21, 1976

[30] Foreign Application Priority Data

Oct. 24, 1975 Japan .................. 50-127392

[51] Int. Cl.$^2$ .................................. H03F 3/183
[52] U.S. Cl. .......................... 330/13; 179/1 A; 330/22; 330/40
[58] Field of Search ............ 330/13, 15, 18, 22, 330/24, 40, 70, 71; 179/1 A

[56] References Cited

U.S. PATENT DOCUMENTS 3,772,606  11/1973  Waehner ................ 330/22 X

Primary Examiner—James B. Mullins
Attorney, Agent, or Firm—Craig and Antonelli

[57] ABSTRACT

The same input signal is applied to each of the bases of a pair of amplifying transistors, while an output signal is produced at the emitter of one of the pair of transistors. The collector of the one transistor is connected to the emitter of the other transistor. The junction point between the collector of the one transistor and the emitter of the other transistor is connected through a diode to a first DC power source of low voltage. A second power source of high voltage is connected to the collector of the other transistor, thereby selectively supplying electric power to the one transistor in accordance with the signal level of the input signal. An inductance element is connected in series with the diode to generate a counter electromotive force to prevent a reverse current from flowing through the diode during the cut-off state of the diode, thus providing a highly efficient amplifier with little distortion.

7 Claims, 3 Drawing Figures

LOW-FREQUENCY POWER AMPLIFIER

The present invention relates to an amplifier circuit, or more in particular to a low-frequency power amplifier suitable for amplifying an audio signal with high efficiency.

Most of the conventional output amplifiers used for audio signals are amplifiers for class "B" amplification. Such a class "B" amplifier is suitable for amplification of a large output because it is more efficient than a class "A" amplifier and therefore generates less heat. Even such a class "B" output amplifier has the efficiency of only approximately 70% at the maxmum output, and its efficiency is lower at small output. Therefore, an output amplifier of large output, even using a class "B" amplifier circuit, still generates a great amount of heat, thus making difficult the heat-dissipation design. In an output amplifier made of integrated circuit, on the other hand, the generation of heat limits the available maximum output of the output amplifier.

Consider, for example, an output amplifier including a single transistor having an emitter connected to a load resistor, a collector impressed with a source voltage, and a base supplied with an input voltage. Let the source voltage be Vcc, and the voltage applied to the base Vin. The efficiency $\eta$ of this output amplifier is expressed as $$\eta = \frac{\text{Power consumed by load resistor}}{\text{Power supplied from power source}} = \frac{V_{in}}{V_{cc}} \quad (1)$$

It will be seen that the higher the input voltage Vin to approach the source voltage Vcc the higher the efficiency $\eta$.

An output amplifier for audio signals is used in such a manner that the voltage of the input signal, even at its maximum level, does not exceed the source voltage in order to prevent the deterioration of the sound quality due to otherwise distorted waveforms of the output signal. For this purpose, signals with most frequent amplitude are generally set at a signal level considerably lower than the source voltage. As a result, the output amplifier is operated with low efficiency.

To obviate this shortcoming, the inventors have suggested, as disclosed in U.S. Pat. No. 3,961,280, an amplifier of improved efficiency in which a plurality of power sources of different voltages are selectively connected to amplifier elements in accordance with the signal level of the input signal supplied to the amplifier elements, so that the amplifier elements may operate always at or in proximity to their maximum output.

In the amplifier disclosed in the U.S. Pat. No. 3,961,280, the collector of a first transistor of one conductivity is connected to the emitter of a second transistor of the same conductivity, and the same input signal is applied to the bases of the first and second transistors. A load is inserted between the emitter of the first transistor and a reference potential point. A first DC power source of low voltage is inserted between the reference potential point and the junction between the collector of the first transistor and the emitter of the second transistor through diode, while a second DC power source of high voltage is inserted between the collector of the second transistor and the reference potential point. When the signal level of the input signal is lower than the voltage of the first DC power source, electric power is supplied through the diode to the first transistor from the first DC power source, while when the signal level of the input signal is higher than the voltage of the first DC power source, the diode is cut off and electric power is supplied from the second power source to the first transistor through the second transistor, thus reducing the power consumption of the first transistor for an improved efficiency. In the case where the signal level of the input signal is lower than the voltage of the first DC power source, the second transistor is reverse-biased and cut off by the first DC power source, and when the input signal level exceeds the voltage of the first DC power source, this signal voltage causes the second transistor to be forward-biased into conductive state. In this case, the diode is reverse-biased and cut off by the signal voltage and the voltage of the second DC power source.

In this way, the diode and the second transistor are alternatively cut off and made to conduct so that the first transistor is kept almost at maximum output to provide a highly efficient amplifier.

In this amplifier, however, when the diode is cut off and the second transistor conducts, a reverse current flows through the diode so as to reduce the current in the load for a short time, resulting in a distortion of the output signal. In other words, since a large current flows through the diode connected between the collector of the first transistor and the first DC power source, a rectifying diode for large power is used as such a diode. Such a rectifying diode, however, has the disadvantage that the carriers stored in the semiconductor by the forward current cause, even with reverse bias voltage supplied, a reverse current to continue to flow until the carrier are completely eliminated by the reverse current, resulting in a long backward recovery time. Commonly-used rectifying diodes have the current capacity of the order or 2 amperes and the backward recovery time of 2 $\mu$sec to 3 $\mu$sec. During this recovery time of 2 to 3 $\mu$sec, no current, i.e., no signal may be supplied to the load, thereby causing a distortion of the output signal.

In such an audio amplifier as to reproduce music signals of an orchestra or other performances recorded on a disc record, the signal level is low on an average but sometimes an audio signal of higher level associated with a percussion or wind instrument is amplified. In such a case, the output signal is distorted, and a sound signal containing this distorted signal component is reproduced as a loud sound from the speaker to the annoyance of listernes.

An object of the present invention is to provide a highly efficient low-frequency power amplifier with little distortion.

Another object of the invention is to provide a highly efficient low-frequency power amplifier capable of preventing the distortion easily.

According to the present invention in a power amplifier comprising a first and second transistor having the same conductivity to each other, the collector of the first transistor being connected to the emitter of the second transistor, the respective bases of the first and second transistors being supplied with the same input signal, an output signal being taken out of the emitter of the first transistor, a first DC power source connected to the collector of the first transistor through a diode for supplying electric power therefrom, and a second DC power source of higher voltage than the first DC power source connected to the collector of the second transistor for supplying electric power therefrom, an inductance element is connected in series with the diode so that a counter electromotive force is generated in the inductance element during the cut-off of the diode so as to prevent the reverse current from flowing through the diode to thereby prevent the generation of distortion of the output signal.

According to the present invention, the efficiency of the low-frequency amplifier is improved with smaller power consumption. Further, the distortion is reduced even for a large input signal.

Figure 2:
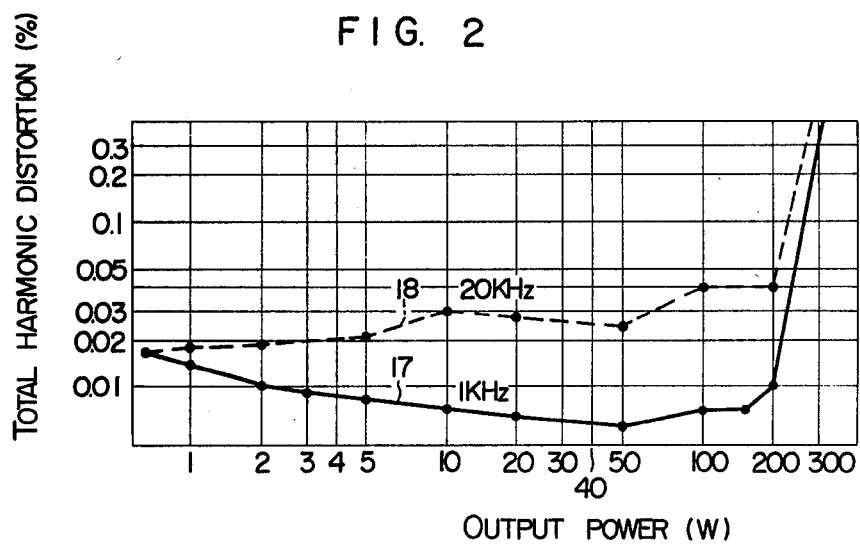
Figure 3:
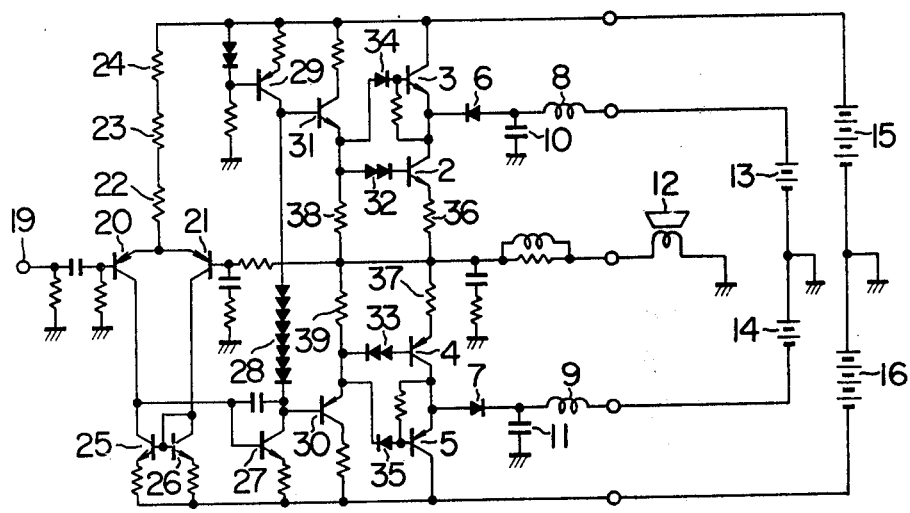

The above and other objects, features and advantages will be made apparent by the detailed description taken in conjunction with the accompanying drawings, in which: FIG. 1 is a basic circuit diagram showing an embodiment of the low-frequency power amplifier according to the present invention;

FIG. 2 is a distortion characteristics diagram showing the relation between out and distortion; and FIG. 3 is a diagram showing a specific circuit of the low-frequency power amplifier according to the present invention.

FIG. 1 shows a basic circuit diagram of a low-frequency power amplifier of push-pull type according to the present invention. Reference numeral 1 shows a signal source from which low-frequency input signals are supplied to the amplifier. The signal source 1 has two terminals, one of which is grounded and the other connected to the respective bases of first, second, third and fourth transistors 2, 3, 4 and 5. The first transistor 2 and the second transistor 3 may be power transistors of the same conductivity, such as NPN type as shown in the drawing. The third transistor 4 and the fourth transistor 5 may also be power transistors of the same conductivity which is, however, opposite to the conduction type of the transistors 2 and 3, such as PNP type as shown in the drawing. The collector of the transistor 2 is directly connected to the emitter of the transistor 3, while the collector of the transistor 4 is directly connected to the emitter of the transistor 5. The respective emitters of the transistors 2 and 4 are coupled to each other and a load resistor 12 is inserted between the junction of these emitters and the earth. The collector of the transistor 2 is connected to the cathode of a first diode 6, while the collector of the transistor 4 is connected to the anode of a second diode 7. The anode of the diode 6 is grounded through a capacitor 10, and also connected to an end of a first inductance element or compensating coil 8. Further, the cathode of the diode 7 is grounded through a capacitor 11, and also connected to an end of a second inductance element or compensating coil 9. The other end of the first compensating coil 8 is connected to the positive terminal of a first low-voltage DC power source 13, while the other end of the second compensating coil 9 is connected to the negative terminal of a second low-voltage DC power source 14. The first and second DC power sources 13 and 14 have the same magnitude of voltage. The negative terminal of the power source 13 and the positive terminal of the power source 14 are connected directly to each other and further to the ground. The collector of the transistor 3 is connected to the positive terminal of a third high-voltage DC power supply 15, while the collector of the transistor 5 is connected to the negative terminal of a fourth high-voltage DC power source 16. The third and fourth DC power sources 15 and 16 have the same magnitude of voltage which is higher than that of the first and second power sources 13 and 14. The negative terminal of the power source 15 and the positive terminal of the power source 16 are connected directly to each other and further grounded.

A first transistor pair consisting of the first and second transistors 2 and 3 and a second transistor pair consisting of the third and fourth transistors 4 and 5 function as a complementary circuit. Further, an output signal is applied to the load resistor 12 from an output terminal of the circuit, thus making up a single ended push-pull circuit.

In this circuit, the transistors 2 and 3 are in conductive state during the positive half cycles of the low-frequency signal supplied from the signal source 1 to amplify the signal in the positive half cyles, whereas the transistors 4 and 5 are adapted to conduct during the negative half cycles of the low-frequency signal supplied from the signal source 1 to amplify the signal in the negative half cycles. Since the diode 6 is forward-biased by the power source 13, upon the application of a positive half cycle of the low-frequency signal to the base of the transistor 2 so as to cause the transistor 2 to be a conductive state, a forward current flows in the diode 6 from the power source 13 and is supplied as a collector current to the transistor 2. In the case where the input signal level of the positive half cycle of the low-frequency signal applied to the bases of the transistors 2 and 3 is lower than the collector voltage of the transistor 2, however, the transistor 3 is reverse-biased by the collector voltage of the transistor 2 and therefore fails to conduct and remains in a cut-off state. In the event that the signal level of the low-frequency signal is low, therefore, power is supplied via the diode 6 of the transistor 2 from the power source 13 so that the signal may be amplified only by the transistor 2. In this case, since the voltage of the power source 13 is low, the power supplied to the load resistor 12 approaches the power supplied by the power source 13, resulting in a high efficiency of the amplifier.

When the signal level of the positive half cycle of the signal supplied to the bases of the transistors 2 and 3 exceeds the collector voltage of the transistor 2, the transistor 3 is caused to be a conductive state at this signal level, so that electric power may be supplied to the collector of the transistor 2 via the transistor 3 from the power source 15. Under this condition, since the voltage of the power source 15 is applied to the collector of the transistor 2 the collector voltage thereof is higher than the voltage of the power source 13, with the result that the diode 6 is reverse-biased into a cut-off state. The transistors 2 and 3, supplied with electric power from the power source 15, amplify the positive half cycle of the signal and apply the output thereof to the load resistor 12.

The diode 7 is supplied with a forward bias by the power source 14. When the negative half cycle of the signal is supplied to the base of the transistor 4 and this transistor 4 conducts, a forward current flows in the diode 7, so that power is supplied from the power source 14 to the transistor 4 through the diode 7. In the case where the absolute value of the negative half cycle of the signal is smaller than the absolute value of the collector voltage of the transistor 4, the transistor 5 is cut off, with the result that electric power is supplied to the transistor 4 through the diode 7. When the absolute value of the signal level of the negative half cycle exceeds the absolute value of the collector voltage of the transistor 4, on the other hand, the transistor 5 conducts, so that power is supplied to the collector of the transistor 4 from the power source 16, thereby cutting off the diode 7. The negative half cycle of the signal is amplified by the transistors 4 and 5 are supplied to the load resistor 12.

When the output power of the amplifier is large, a large current flows in the diodes 6 and 7, and therefore these diodes 6 and 7 preferably have a large electric capacity. As long as the diodes 6 and 7 are in a conductive state and a forward current is flowing therein, carriers are stored in the secmiconductive bodies thereof. Even after the diodes 6 and 7 are reverse-biased, a reverse current continues to flow therein until the stored carriers are eliminated, thus causing a distortion. When the signal level of the positive half cycle supplied to the bases of the transistors 2 and 3 exceeds the collector voltage of the transistor 2 and a reverse bias is applied to the diode 6, the large current that has thus far flowed in the first compensating coil 8 is cut off. At this very instant, a counter electromotive force of such a polarity as to act to continue the current flow in the compensating coil 8 is generated. The direction of the current caused by the counter electromotive force to flow in the compensating coil 8 is the same as that of the forward current of the diode 6. This counter electromotive force blocks the reverse current of the diode 6, so that the diode 6 is cut off the instant it is supplied with a reverse bias. In this way, the power supplied to the load resistor 12 is reduced, thereby preventing the generation of a distortion. Further, the capacitor 10 suppresses the ringing which otherwise might be generated by the compensating coil 8.

The same principle may be applied also to the diode 7. In other words, the instant a reverse bias is applied to the diode 7, a counter electromotive force is generated in the compensating coil 9 in such a manner as to block the reverse current of the diode 7, so that the diode 7 is immediately cut off. Furthermore, the capacitor 11 suppresses the ringing of the compensating coil 9.

The relation between the output and distortion of the amplifier shown in FIG. 1 is illustrated in FIG. 2. In this figure, the output power and total harmonic distortion are plotted respectively horizontally and vertically. The load resistor involved has the value of 8 Ω. The characteristics curve of solid line 17 shows the case where the signal of 1 KHz is amplified, while the dotted line curve 18 denotes the case of amplification of the signal of 20 KHz. It will be seen that for the signal of 1 KHz, the distortion is less than 0.01% for the output of 2 to 200 watt, indicating that the reverse current for the diodes 6 and 7 of FIG. 1 is blocked.

The diagram of FIG. 3 shows a specific circuit of the low-frequency power amplifier according to the present invention which includes a preamplifier for amplifying a small signal and a driver circuit in the stage prior to the amplifier shown in FIG. 1. In FIG. 3, an input terminal 19 is connected to the base of a PNP transistor 20 for preamplification. The transistor 20, together with a transistor 21, make up a differential amplifier. The emitters of the transistors 20 and 21 are commonly connected to a third DC power source 15 through three resistors 22, 23 and 24 connected in series. The collector of the transistor 20 is connected to the collector of an NPN transistor 25 for providing a constant-current circuit, while the collector of the transistor 21 is connected to the collector of a transistor 26 acting as a diode. The collector of the transistor 20 is further connected to the base of a transistor 27. The collector of the transistor 27 is in turn connected through a plurality of bias diodes 28 to the collector of a transistor 29 and the base of a drive transistor 31. The collector of the transistor 27 is further connected to the base of a drive transistor 30 directly. The emitters of the transistors 30 and 31 are connected to the output point through the resistors 38 and 39 respectively. Further, the emitter of the transistor 30 is connected through a diode 33 to the base of an output transistor 4 on the one hand and to the base of an output transistor 5 through a diode 35 on the other. The emitter of the transistor 31 is connected to the base of an output transistor 3 through a diode 34 on the one hand and to the base of an output transistor 2 through a diode 32 on the other. The emitters of the transistors 2 and 4 are connected to a speaker 12 through protective resistors 36 and 37 respectively. Diodes 6 and 7 are connected in series with first and second compensating coils 8 and 9 respectively.

The input terminal 19 of this low-frequency power amplifier is impressed with a low-frequency signal. This low-frequency signal is amplified by the transistor 20 which produces an output at the collector thereof which is in turn applied to the transistor 27. This signal is further amplified by the transistor 27 and applied to the drive transistors 30 and 31 and amplified therein so as to drive the output transistors 2, 3, 4 and 5 respectively. The outputs of the transistors 2, 3, 4 and 5 are supplied to the speaker 12, where it is converted into a sound signal and reproduced. The output transistors 2, 3, 4 and 5, like the amplifier shown in FIG. 1, operate such that the transistor 3 and the diode 6 are alternatively conductive in accordance with the input signal level of the signal applied to the transistors 2 and 3 and the transistor 5 and the diode 7 are also operated in the same manner as above, thus efficiently amplifying the signal. Also, the instant reverse bias is applied to the diode 6 or 7, a counter electromotive force is generated in the compensating coil 8 or 9, respectively, thereby preventing a reverse current from flowing through the diode 6 or 7.

As will be seen from the foregoing description in the low-frequency power amplifier according to the present invention, a reverse current is prevented from flowing in the diodes provided for switching the power sources when a large input signal is applied, so that the switching of the power sources may be smoothly effected so as to prevent a distortion which otherwise might occur upon the power source switching. Further, the blocking of the reverse current in the diodes is effected by the use of the compensating coils so simply that generation of the distortion is prevented without any special control circuit. By the way, the compensating coils may be connected alternatively between the first and second power sources and the earth.

What is claimed is:
1. A low-frequency power amplifier comprising:
a first and a second active element of the same conduction type, each including a first terminal for receiving an input signal, a second terminal for taking out an output therefrom and a third terminal adapted to be supplied with electric power, each of said first and second active elements being capable of amplifying said input signal;
means for applying an input signal to said first terminal of each of said first and second active elements;
a load inserted between said second terminal of said first active element and a reference potential point;
a first DC power supply;

a diode inserted in a current path between said first DC power source and said third terminal of said first active element in the forward direction with respect to the DC current flowing from said first DC power source;

an inductance element inserted in series with said diode in said current path of said first DC power source;

a second DC power source having a voltage higher than that of said first power source;

a first DC conductive means for connecting the third terminal of said second active element to said second DC power source; and a second DC conductive means for connecting said second terminal of said second active element to said third terminal of said first active element.

2. A low-frequency power amplifier comprising:

a first transistor having an input terminal, an output terminal and a common terminal;

means for supplying an input signal to said input terminal of said first transistor;

a load connected between said output terminal of said first transistor and a reference potential point;

a first DC power source;

a first DC conductive means for connecting said first DC power source to said common terminal of said first transistor;

a diode inserted in series in a current path from said first DC power source to said first transistor in the forward direction with respect to the direction of the DC current flowing from said first DC power source;

in inductance element inserted in series with said diode in said current path of said first DC power source;

a second power source having a voltage higher than that of said first DC power source;

a second transistor having an input terminal, an output terminal and a common terminal;

means for connecting the input terminal of said second transistor to the input terminal of said first transistor;

a second DC conductive means for connecting the output terminal of said second transistor to the common terminal of said first transistor; and a third DC conductive means for connecting the common terminal of said second transistor to said second DC power source, said diode being made to conduct when the signal level of said input signal is lower than a predetermined level and being biased in a cut-off state when the signal level of said input signal is higher than said predetermined level, said inductance element generating a counter electromotive force thereby to prevent a reverse current from flowing through said diode when said diode is in a cut off state.

3. A low-frequency power amplifier comprising:

a first, a second, a third and a fourth active element, each having an input terminal, an output terminal and a common terminal;

means for supplying a positive half cycle of an input signal to the respective input terminals of said first and second active elements;

means for supplying a negative half cycle of said input signal to the respective input terminals of said third and fourth active elements;

a load connected between the output terminals of said first and third active elements and a reference potential point;

a first DC conductive means for connecting the common terminal of said first active element to the output terminal of said second active element;

a second DC conductive means for connecting the common terminal of said third active element to the output terminal of said fourth active element;

a first DC power source for supplying a bias current to the common terminal of said first active element;

a second DC power source for supplying a bias current to the common terminal of said third active element and having a voltage equal to that of said first DC power source;

a first diode connected in series in a current path from said first DC power source to said first active element and adapted to conduct when the signal level of the input signal applied to said first active element is lower than a predetermined level and to be cut off when the signal level of the input signal applied to said first active element is higher than said predetermined level;

a second diode connected in series in a current path from said DC power source to said third active element and adapted to conduct when the absolute value of the signal level of the input signal applied to said third active element is lower than said predetermined level and to be cut off when the absolute value of the signal level of said input signal applied to said third active element is higher than said predetermined level;

a first inductance element connected in series with said first diode, for generating a counter electromotive force thereby to prevent a reverse current from flowing through said first diode when said first diode is cut off;

a second inductance element connected in series with said second diode, for generating a counter electromotive force thereby to prevent a reverse current from flowing through said second diode when said second diode is cut off;

a third DC power source having a voltage higher than that of said first DC power source and for supplying a bias current to the common terminal of said second active element; and a fourth DC power source having a voltage equal to said DC power source and for supplying a bias current to the common terminal of said fourth active element.

4. A low-frequency power amplifier according to claim 3, in which each of said first, second, third and fourth active elements is a power transistor having a base, an emitter and a collector.

5. A low-frequency power amplifier comprising:

a pair of power transistors of the same conduction type, each of said transistors having a base, an emitter and a collector;

means for supplying an input signal to the base of each of said transistors;

a load connected between the emitter of one of said pair of transistors and a reference potential point;

a first DC conductive means for connecting the emitter of the other of said pair of transistors to the collector of said one transistor;

a first DC power source;

a second DC conductive means for connecting said first DC power source to the collector of said one transistor;

a diode connected in series with a current path from said first DC power source to said one transistor in the forward direction with respect to the direction of the DC current flowing from said first power source;

an inductance element connected in series with said diode in said current path; and a second DC power source having a voltage higher than that of said first DC power source and connected through a third DC conductive means to the collector of said other of said transistors.

6. A low-frequency power amplifier comprising:

at least a pair of transistors of the same conduction type;

each of said transistors having an input electrode, an output electrode and a common electrode;

means for supplying the same input signal to the input electrode of each of said transistors;

a loud speaker inserted between the output electrode of one of said transistors and a reference potential point;

means for connecting the output electrode of the other of said transistors to the common electrode of said one of said transistors;

a first DC power source;

a diode inserted between said first DC power source and the common electrode of said one of said transistors and having the forward direction coincident with the direction of the flow of the DC current of said power source;

a compensating coil inserted between said diode and said first DC power source; and a second DC power source having a voltage higher than that of said first DC power source and connected to the common electrode of said other of said transistors;

7. In an amplifier circuit of high efficiency for use as an output circuit of an amplifier comprising a first transistor for amplifying an incoming input signal applied to a base of said first transistor, a load connected to an emitter of said first transistor, a second transistor of the same conductivity type as that of said first transistor having an emitter connected to a collector of said first transistor, means for supplying the incoming input signal to a base of said second transistor, a first power source, a diode connected between the collector of said first transistor and said first power source in a manner so that said diode is forward-biased by said first power source and operatively applies a collector bias voltage to the collector of said first transistor so long as the diode is conducting, a second power source for producing a voltage higher than that of said first power source, and means for connecting said second power source to a collector of said second transistor, an improvement which comprises:

an impedance element connected in series to said diode and inserted in a circuit through which a collector current for said first transistor flows, whereby preventing a reverse current from flowing through said diode when said diode is cut off.

* * * * *